(12) United States Patent
Ishihara et al.

(10) Patent No.: US 7,491,097 B2
(45) Date of Patent: Feb. 17, 2009

(54) MOUNTING STRUCTURE OF CURRENT SENSOR

(75) Inventors: Masato Ishihara, Anjo (JP); Masahiro Aratani, Okazaki (JP); Takashige Saitou, Ama-gun (JP)

(73) Assignee: DENSO CORPORATION, Kariya (JP)

( * ) Notice: Subject to any disclaimer, the term of this patent is extended or adjusted under 35 U.S.C. 154(b) by 378 days.

(21) Appl. No.: 11/334,433

(22) Filed: Jan. 19, 2006

(65) Prior Publication Data
US 2006/0216800 A1  Sep. 28, 2006

(30) Foreign Application Priority Data
Mar. 2, 2005  (JP) ............... 2005-058044

(51) Int. Cl.
G01R 33/00 (2006.01)
(52) U.S. Cl. .................. 439/763; 324/117 H; 439/957
(58) Field of Classification Search ............... 439/763, 439/754, 755, 488, 957; 320/105; 324/117 H, 324/117 R
See application file for complete search history.

(56) References Cited
U.S. PATENT DOCUMENTS 4,675,255 A * 6/1987 Pfeifer et al. ............... 429/92
5,831,425 A * 11/1998 Ochiai ...................... 324/117 R
6,218,805 B1 * 4/2001 Melcher ..................... 320/105
6,515,468 B1 * 2/2003 Morimoto et al. ......... 324/117 H
6,551,147 B2   4/2003 Wakata et al.
7,319,304 B2 * 1/2008 Veloo et al. ................ 320/134
7,352,164 B2 * 4/2008 Guillon .................... 324/76.11

FOREIGN PATENT DOCUMENTS

JP      A-2001-66327    3/2001
JP      A-2002-267692   9/2002

* cited by examiner

Primary Examiner—Neil Abrams
(74) Attorney, Agent, or Firm—Posz Law Group, PLC

(57) ABSTRACT

A mounting structure of a current sensor includes: the current sensor including a detection portion; and a connection member for electrically connecting between a battery post of a battery and a harness. The current sensor is mounted on the connection member. The connection member includes a predetermined portion, a current density of which is higher than that of other portions of the connection member. The detection portion of the current sensor is disposed on the predetermined portion of the connection member when the current sensor is mounted on the connection member. The mounting structure may include a pair of holes, one for connection at the battery post, the other one for connection to the harness.

10 Claims, 5 Drawing Sheets

MOUNTING STRUCTURE OF CURRENT SENSOR

CROSS REFERENCE TO RELATED APPLICATION

This application is based on Japanese Patent Application No. 2005-58044 filed on Mar. 2, 2005, the disclosure of which is incorporated herein by reference.

FIELD OF THE INVENTION

The present invention relates to a mounting structure of a current sensor.

BACKGROUND OF THE INVENTION

A mounting structure of a current sensor between a battery and a harness is disclosed in, for example, Japanese Patent Application Publication No. 2002-141054, which corresponds to U.S. Pat. No. 6,551,147. The current sensor is mounted on a junction member made of a conductive metallic plate having a rectangle shape. The junction member is disposed between a battery side terminal and a harness side terminal. The battery side terminal is connected to a battery post of a battery. The harness side terminal is connected to a top of a harness. In this structure for mounting the current sensor, the battery side terminal and the harness side terminal can be provided by conventional terminals.

Here, the current sensor is formed in such a manner that a ring shaped detection element is embedded in a resin mold by an insert-molding method. The detection element includes a Hall element and a magnetic field concentration core. A slit is formed in a center of the magnetic field concentration core. By using the slit in the core, the junction member can penetrate through the slit.

However, when the mounting structure includes the magnetic field concentration core, the shape of the current sensor is limited. Accordingly, it is difficult to minimize the dimensions of the mounting structure. Further, the mounting position, i.e., the arrangement of the current sensor is limited. Here, if the mounting structure includes no magnetic field concentration core, the sensitivity of the current sensor is reduced.

SUMMARY OF THE INVENTION

In view of the above-described problem, it is an object of the present invention to provide a mounting structure of a current sensor having high sensitivity.

A mounting structure of a current sensor includes: the current sensor including a detection portion; and a connection member for electrically connecting between a battery post of a battery and a harness. The current sensor is mounted on the connection member. The connection member includes a predetermined portion, a current density of which is higher than that of other portions of the connection member. The detection portion of the current sensor is disposed on the predetermined portion of the connection member when the current sensor is mounted on the connection member.

In the above structure, since the detection portion of the current sensor is disposed on the high current density predetermined portion of the connection member, the magnetic flux density functioning the detection portion of the current sensor becomes larger. Thus, the sensor sensitivity is improved.

Alternatively, the predetermined portion of the connection member may include at least one portion having a cross section, which is smaller than that of the other portions of the connection member.

Alternatively, the connection member may include a notch so that a narrow portion of the connection member provides the predetermined portion having high current density, and at least a part of the current sensor may be press-inserted into the notch of the connection member so that the detection portion of the current sensor is disposed on the narrow portion of the connection member. Alternatively, the connection member may have an oblong plate shape with a width, and the notch may have a width, which is equal to or smaller than a half of the width of the connection member. Alternatively, the current sensor may include an anisotropic magneto resistance effect element. Alternatively, the anisotropic magneto resistance effect element may face the narrow portion of the connection member.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
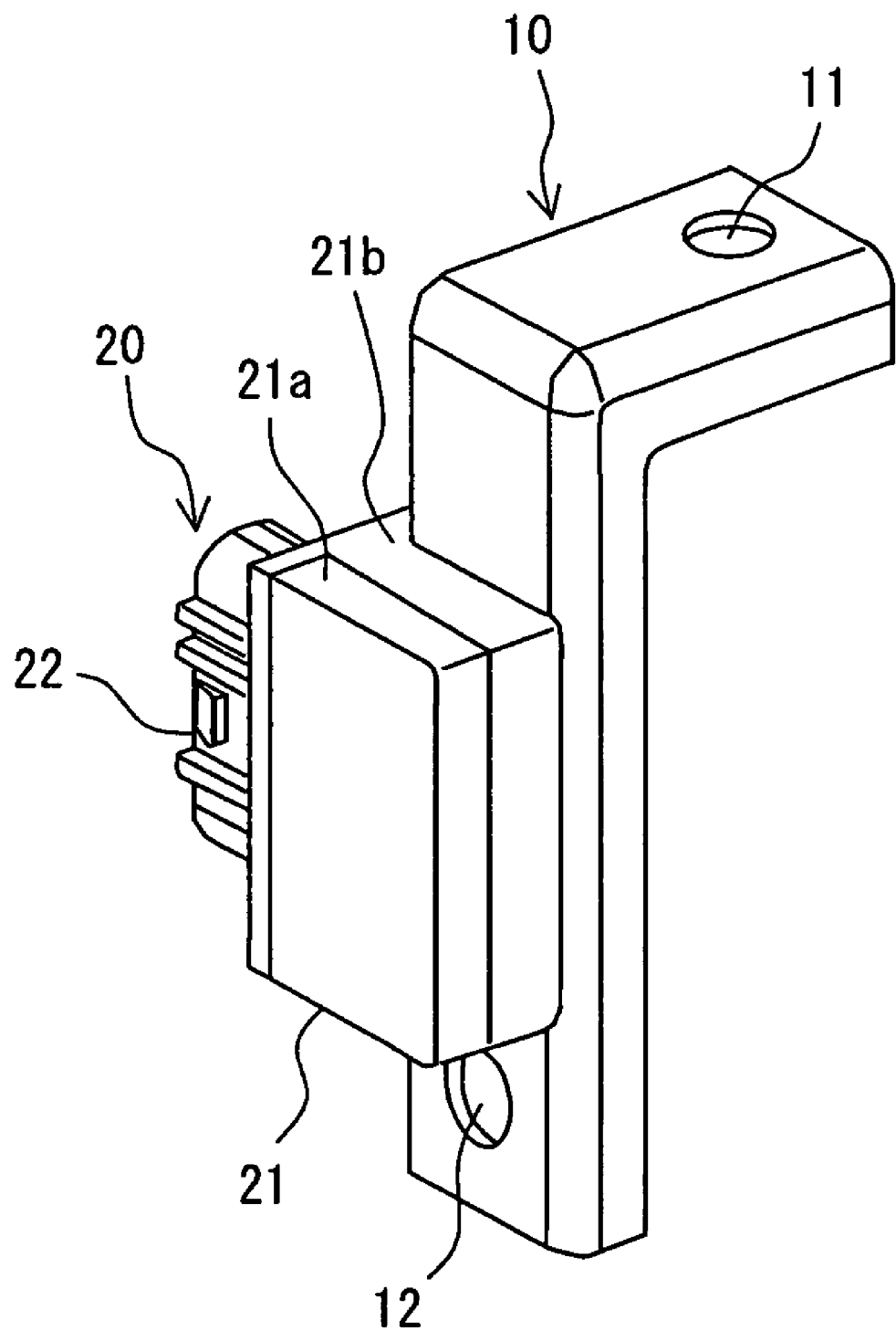
FIG. 1 is a schematic perspective view showing a mounting structure of a current sensor according to a first embodiment of the present invention.
Figure 2A:
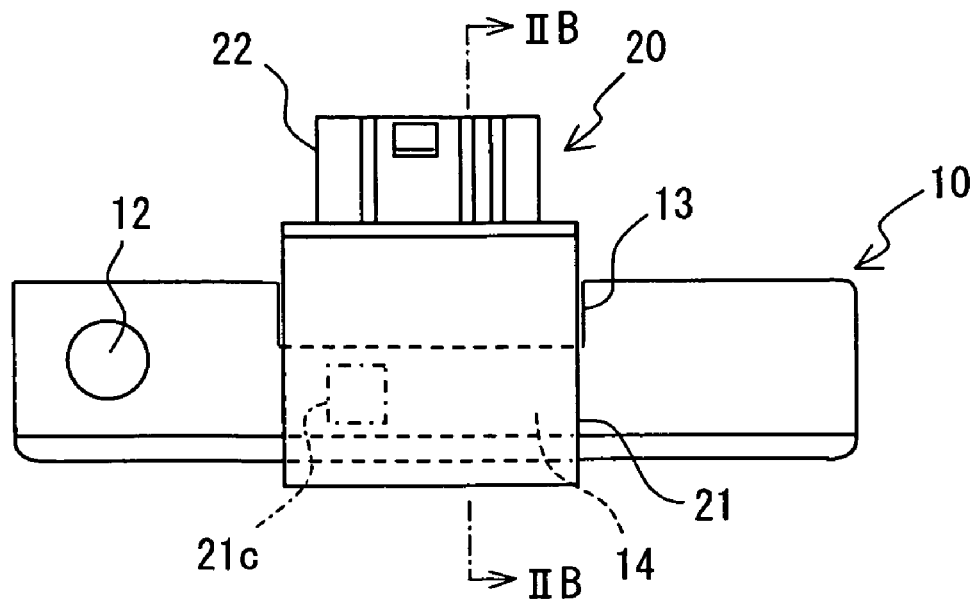
FIG. 2A is a plan view showing the mounting structure seeing from a cover side of the current sensor.
Figure 2B:
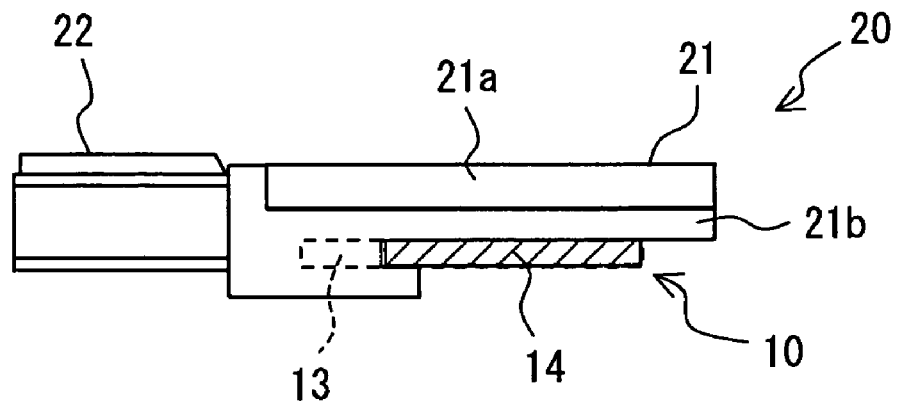
FIG. 2B is a partial cross sectional view showing the mounting structure taken along line IIB-IIB in FIG. 2A.

A mounting structure of a current sensor according to a first embodiment of the present invention is shown in FIGS. 1 to 2B. FIG. 2A is a plan view seeing from a cover side of the current sensor in FIG. 1. The mounting structure of the current sensor is provided such that a current sensor 20 is fixed to a connection member 10. The connection member 10 connects between a battery post and a harness (not shown). The battery post is an electrode of a battery (not shown) mounted on an automotive vehicle, and the harness is connected to a load.

The connection member 10 is made of conductive material. In this embodiment, the connection member 10 is made of brass, i.e., alloy of copper and zinc. Specifically, the connection member 10 is formed of a brass plate having a L-shape.

Both ends of the connection member 10 have through holes 11, 12 for connecting and fixing. The through hole 11 is engaged to a through hole (not shown) of a battery terminal connected to the battery post so that the connection member 10 and the battery terminal are screwed and connected by connection means through the through holes. The through hole 12 is engaged to a through hole (not shown) of a connection terminal disposed on a battery side of the harness so that the connection member 10 and the harness are screwed and connected by other connection means through the through holes.

As shown in FIG. 2A, the connection member 10 further includes a notch portion 13 for press-inserting the current sensor 20 between the through holes 11, 12. Thus, the current sensor 20 is mounted in the notch 13. A part of the connection member 10 is completely removed in a plate thickness direction so that the notch 13 is formed. By forming the notch 10, the connection member 10 has a narrow portion 14, through which current flows, i.e., a current path of the narrow portion is narrowed. Specifically, the connection member 10 has the narrow current path between the battery and the harness. This effect is described later. The connection member 10 is formed by a well-known method such as a press working method.

The current sensor 20 includes a sensor portion 21 and a connector portion 22. The sensor portion 21 has a converter for converting a magnetic field to an electric power. The connector portion 22 outputs a signal from the sensor portion 21 to an external circuit.

The sensor portion 21 includes a body having a cover 21a and a casing 21b, a sensor chip 21c and a processing circuit (not shown). The sensor chip 21c having the converter for converting the magnetic field and the processing circuit are accommodated in the body. The converter detects a magnetic flux generated by current flowing through the connection member 10, the current being discharge current discharged from the battery or charge current charging to the battery. Thus, the charge current and the discharge current are detected on the basis of detection of the magnetic flux by the converter.

A part of the body is press-inserted into the notch 13 of the connection member 10. The current sensor 20 is mounted on the connection member 10. In this case, at least the sensor chip 21c is disposed on the narrow portion 14 of the connection member 10. Accordingly, no magnetic field concentration core is necessitated, compared with a conventional current sensor formed of a Hall element.

The converter may be formed of an anisotropic magneto resistance effect element (i.e., AMR element), which has high magnetic sensitivity higher than the Hall element.

In this embodiment, not only the part of the body of the sensor portion 21 is press-inserted into the notch 13 of the connection member 10, but also top and bottom surfaces of the connection member 10 is sandwiched by the body of the sensor portion 21. Accordingly, the current sensor 20 is tightly connected to the connection member 10. Further, this method is simple and performed at low cost, compared with an insert-molding method or a bonding method.

Figure 3A:
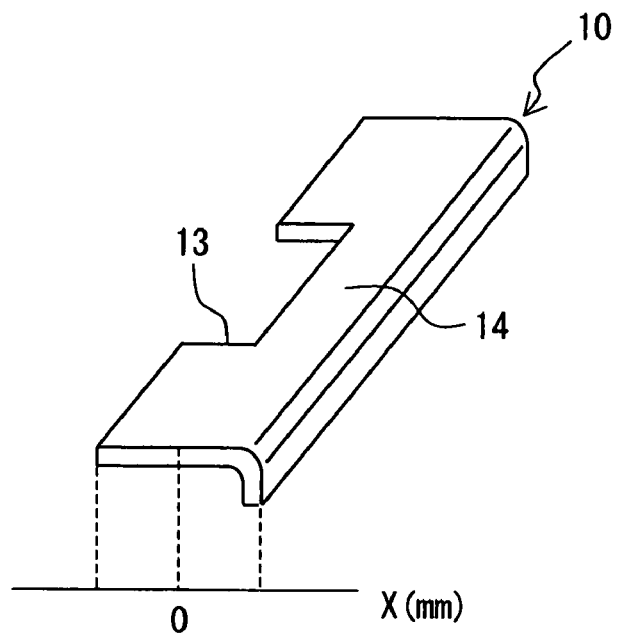
FIG. 3A is a perspective view showing a notch of a connection member.
Figure 3B:
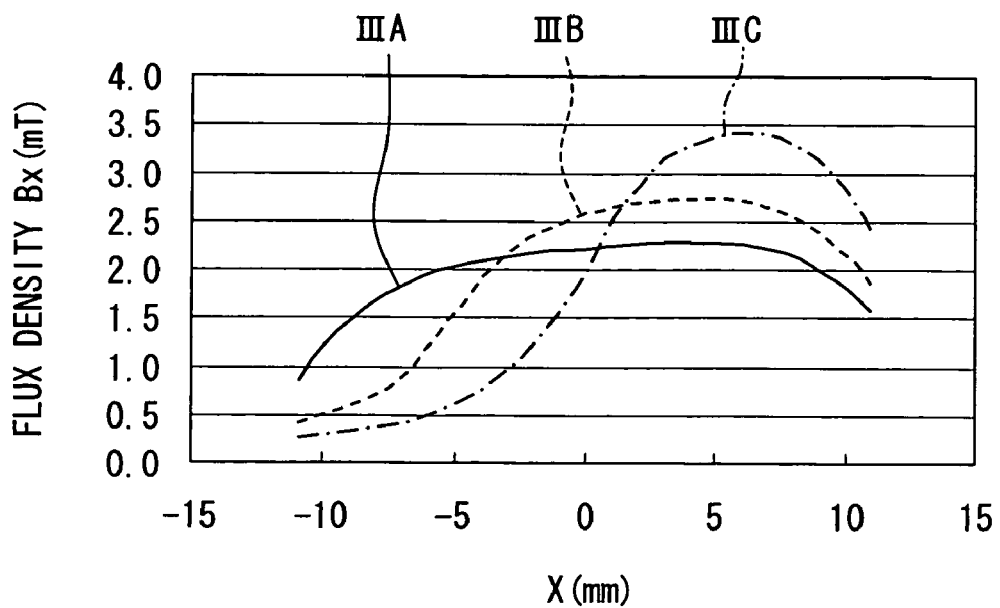
FIG. 3B is a graph showing a relationship between a magnetic flux density and a position of the connection member, according to the first embodiment.

FIG. 3A explains a width of the notch 13, and FIG. 3B shows a relationship between a position X and a magnetic flux density Bx, which is obtained by a FEM analysis.

As shown in FIG. 3A, to increase mechanical strength of the connection member 10, one side of the connection member 10, which is opposite to the notch 13, is bent to be L-shaped. A width of the connection member 10 is 22 mm. The center of the width of the connection member 10 is defined as a reference point, i.e., X=0. A X component of the magnetic flux density Bx in the X direction is simulated, i.e., the flux density Bx in the connection member 10 is simulated. Here, IIIA represents a case where the connection member 10 has no notch, IIIB represents a case where the width of the notch 13 is 5 mm in the x direction, and IIIC represents a case where the width of the notch 13 is 10 mm.

As the width of the notch 13 becomes larger, the maximum flux density Bx becomes larger in a case where the current flowing through the connection member 10 is constant. Specifically, the maximum flux density Bx in a case IIIB of the width of 5 mm is about 20% larger than that in a case IIIA of no notch. The maximum flux density Bx in a case IIIC of the width of 10 mm is about 50% larger than that in a case IIIA of no notch.

This is because the current path of the connection member 10 becomes narrower, specifically, the cross section of the connection member 10 becomes smaller, by forming the notch 13 in a certain portion of the connection member 10, i.e., the narrow portion 14. The current sensor 20 is to be disposed on the certain portion of the connection member 10. Thus, when the current is constant, the current density in the narrow portion 14 of the connection member 10 becomes higher. Accordingly, the narrow portion 14 for arranging the sensor chip 21c becomes a high current density region. Thus, resistance change rate of the AMR element becomes larger, so that the sensitivity of the current is improved.

Here, as the width of the notch 13 becomes larger, i.e., as the cross section of the narrow portion 14 becomes smaller, the current density of the narrow portion 14 becomes larger. However, as the cross section of the narrow portion 14 becomes smaller, the mechanical strength of the connection member 10 becomes smaller. Further, the current sensor 20 and the harness mounted on the connection member 10 are cantilevered to the connection member 10, i.e., the current sensor 20, the harness and the connection member 10 provide a cantilever structure with the battery post as a supporting point. Therefore, when external force is applied to, the current sensor 20 and the harness together with the connection member 10 are vibrated. Accordingly, the width and the length of the notch 13 in the connection member 10 are determined to maintain the mechanical strength of the narrow portion appropriately. Thus, the strength of the narrow portion against the vibration is secured, and further, the current density in the narrow portion is maximized, so that the width and the length of the notch 13 are optimized.

The current sensor 20 is mounted on the connection member 102 by a one-touch simple method. The sensor chip 21c of the current sensor 20 is disposed on the narrow portion 14 of the connection member 10 so that the sensor sensitivity is improved. The range of the comparative high magnetic flux density Bx and the maximum flux density Bx depend on the width of the notch 13. Thus, the width of the notch 13 is determined to arrange the sensor chip 21c in the range of the comparative high magnetic flux density Bx, so that the sensitivity of the current sensor 20 becomes optimum. Further, since no magnetic field concentration core is necessitated, the dimensions of the current sensor 20 are reduced. Accordingly, design degree of freedom of the current sensor 20 is increased, and the arrangement of the current sensor 20 is improved.

Second Embodiment

Figure 4A:
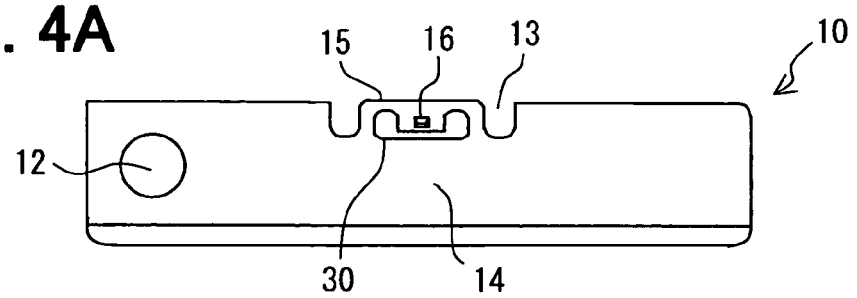
FIG. 4A is a plan view showing a connection member in a mounting structure according to a second embodiment of the present invention seeing from a contact surface side of a current sensor.
Figure 4B:
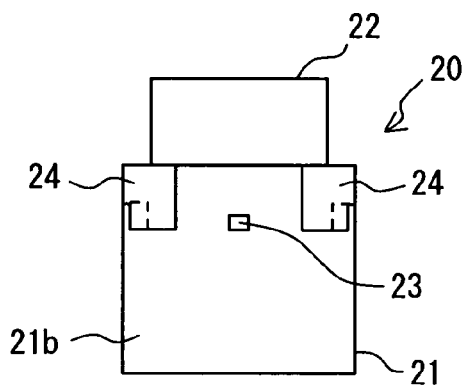
FIG. 4B is a plan view showing the current sensor seeing from a contact surface side of the connection member.
Figure 4C:
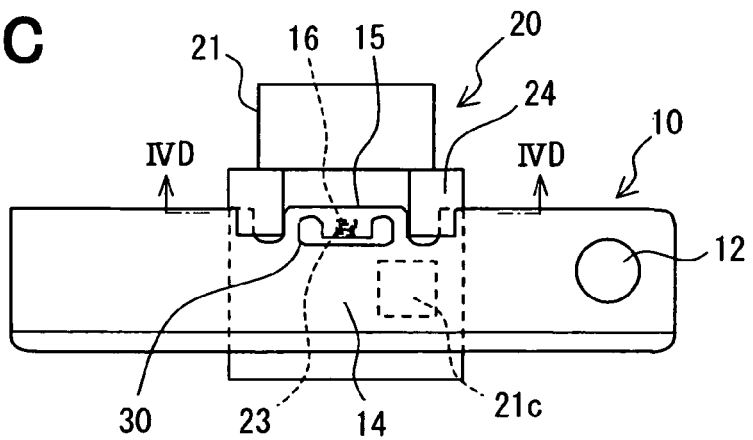
FIG. 4C is a plan view showing the mounting structure.
Figure 4D:
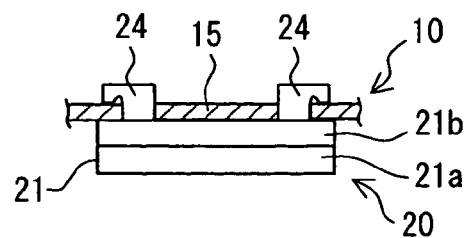
FIG. 4D is a partial cross sectional view showing the mounting structure taken along line IVD-IVD in FIG. 4C.
Figure 5:
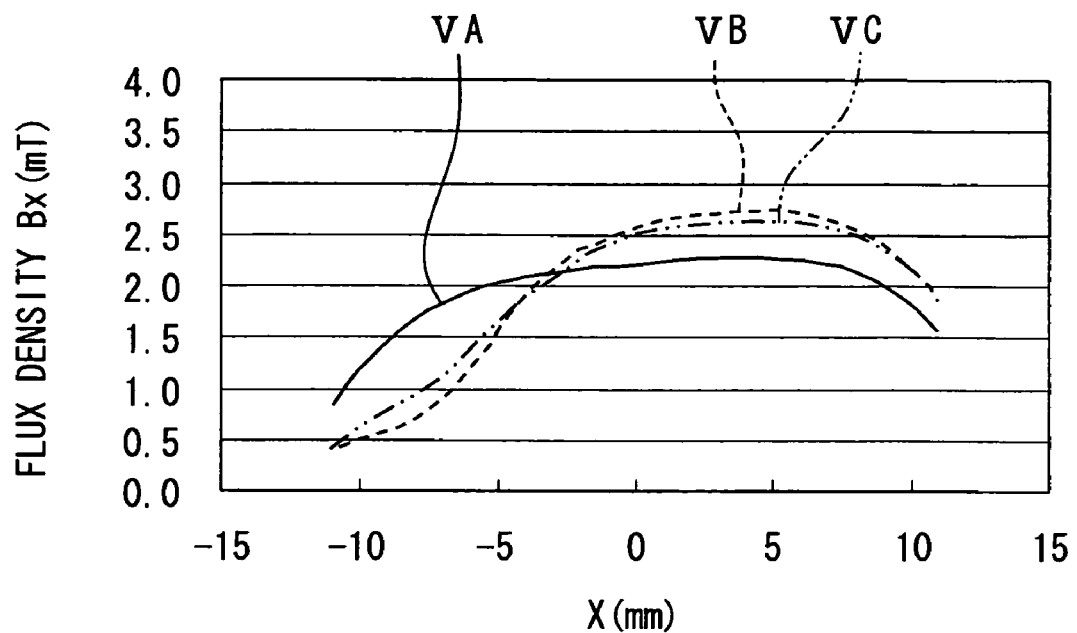
FIG. 5 is a graph showing a relationship between a magnetic flux density and a position of the connection member, according to the second embodiment.

A mounting structure of the current sensor 20 according to a second embodiment of the present invention is shown in FIGS. 4A to 5. FIG. 4A is a plan view of the connection member 10 seeing from the current sensor side, i.e., a contact surface side of the current sensor 20. FIG. 4B is a plan view of the current sensor 20 seeing from the connection member side, i.e., a contact surface side of the connection member. FIG. 4C is a plan view showing the mounting structure of the current sensor 20. FIG. 4D is a cross sectional view showing the mounting structure taken along line IVD-IVD in FIG. 4C. FIG. 5 shows a relationship between a position X and a magnetic flux density Bx, which is obtained by a FEM analysis. Here, VA represents a case where the connection member 10 has no notch, VB represents a case where the width of the notch 13 is 5 mm in the X direction, and VC represents a case of this embodiment. The curves VA and VB in FIG. 5 correspond to the curve IIIA and IIIB in FIG. 3B, respectively.

The current sensor 20 is engaged to the connection member 10, which is different from the mounting structure FIG. 1.

As shown in FIG. 4A, the connection member 10 includes the notch 13 having the width of 5 mm so that the narrow portion 14 having high current density is formed. Further, the connection member 10 further includes a protrusion 15, which is protruded from the bottom of the notch 13. The protrusion 15 has an arc shape. An engagement portion 16 as an engagement protrusion is formed on a part of the protrusion 15. The engagement portion 16 is also protruded in an opening 30. Here, the protrusion 15 may be formed together with the notch 13. Alternatively, the protrusion 15 as an independent part may be bonded to the bottom of the notch 13.

Another engagement portion 16 as an engagement concavity corresponding to the engagement protrusion 16 of the connection member 10 is formed on a contact surface of the casing 21b of the current sensor 20. The contact surface of the casing 21b contacts the connection member 10. Further, a positioning portion 24 as a positioning reference of the current sensor 20 for connecting the connection member 10 is formed on the contact surface of the casing 21b. Specifically, when the contact surface of the casing 21b contacts the protrusion 15 of the connection member 10 and a periphery around the notch 13 so that the current sensor 20 is engaged to the connection member 10, the positioning portion 24 works as the positioning reference.

As shown in FIGS. 4C and 4D, the protrusion 15 of the connection member 10 and the periphery around the notch 13 contact the positioning portion 24 of the current sensor 20 so that the current sensor 20 is positioned at a predetermined position in the lateral direction and in the longitudinal direction. In this case, the engagement protrusion 16 engages with the engagement concavity 23 so that the current sensor 20 is engaged and connected to the connection member 10. Since the protrusion 15 has the arc shape and has flexibility, the engagement protrusion 16 is easily arranged to the engagement concavity 23.

In this mounting structure, the sensor chip 21c of the current sensor 20 is disposed on the narrow portion 14 of the connection member 10. As shown in FIG. 5, although the connection member 10 includes the protrusion 15 in the notch 13, the curve VC of the magnetic flux density Bx in a case where the connection member 10 includes the protrusion 15 is almost the same as the curve VB in a case where the connection member 15 has no protrusion in the notch 13. Thus, the sensor sensitivity in a case where the connection member 10 includes the protrusion 15 is almost the same as that in a case where the connection member 15 has no protrusion in the notch 13. Thus, the mounting structure of the current sensor 20 according to the second embodiment provides to mount the current sensor 20 to the connection member 10 by a one-touch operation. Further, the sensor sensitivity of the current sensor 20 is improved.

The shape of the engagement protrusion 16 may be formed not to drop out from the connection member 10 when external force is applied to the current sensor 20 in an opposite direction to an attachment direction. Specifically, the shape of the engagement protrusion 16 has a slant on the attachment side may become larger. In this case, the current sensor 20 can be fixed and engaged to the connection member 10 more tightly. Further, although the current sensor 20 is engaged to the connection member 10, the current sensor 20 may be press-inserted into the connection member 10. In this case, the current sensor 20 can be connected to the connection member 10 more tightly even when the current sensor 20 is mounted on the connection member 10 by the one-touch operation. For example, the protrusion 15 may be press-inserted between two positioning portions 24.

Although the engagement protrusion 16 is formed on the protrusion 15, the engagement protrusion 16 may be formed on the narrow portion 14. In this case, the connection member 10 includes no protrusion 15. Further, the connection member 10 may include multiple engagement protrusions 16, and the current sensor 20 may includes multiple engagement concavities 23. In this case, the current sensor 20 can be engaged to the connection member 10 more tightly.

MODIFICATIONS

Although the converter for converting the magnetic field to the current is formed of the AMR element, the converter may be formed of another magneto resistance effect element such as a tunnel magneto resistance effect element and a Hall element. Even when the Hall element is used in the current sensor 20, the Hall element is disposed on the narrow portion 14 having the high current density, so that the mounting structure has no magnetic field concentration core. Further, in case of the magneto resistance effect element, the sensor sensitivity is much improved.

Although the connection member 10 includes the notch 13 in order to increase the current density in the narrow portion 14, other methods may be used for increasing the current density in the connection member 10. For example, the connection member 10 includes a thin portion, instead of the notch. In this case, by forming the thin portion, the current density of the connection member 10 is increased.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A mounting structure of a current sensor comprising:
the current sensor including a detection portion; and
a connection member for electrically connecting between a battery post of a battery and a harness, wherein
the current sensor is mounted on the connection member,
the connection member includes a predetermined portion, a current density of which is higher than that of other portions of the connection member,
the detection portion of the current sensor is disposed on the predetermined portion of the connection member when the current sensor is mounted on the connection member;
the connection member includes a notch so that a narrow portion of the connection member provides the predetermined portion having high current density, and at least a part of the current sensor is press-inserted into the notch of the connection member so that the detection portion of the current sensor is disposed on the narrow portion of the connection member.

2. The structure according to claim 1, wherein the predetermined portion of the connection member includes at least one portion having a cross section, which is smaller than that of the other portions of the connection member.

3. The structure according to claim 1, wherein the connection member has two ends, one of which is connected to a battery terminal, and the other one of which is connected to a connection terminal of the harness, and the battery terminal is connected to the battery post of the battery.

4. The structure according to claim 1, wherein the connection member has an oblong plate shape with a width, and the notch has a width, which is equal to or smaller than a half of the width of the connection member.

5. The structure according to claim 4, wherein the notch has an oblong shape, and the connection member includes one side, which is opposite to the notch, the one side of the connection member having L-shape for increasing mechanical strength of the connection member.

6. The structure according to claim 1, wherein the current sensor includes a magneto resistance effect element.

7. The structure according to claim 6, wherein the current sensor includes an anisotropic magneto resistance effect element.

8. The structure according to claim 7, wherein the anisotropic magneto resistance effect element faces the narrow portion of the connection member.

9. A mounting structure of a current sensor comprising:
the current sensor including a detection portion; and
a connection member for electrically connecting between a battery post of a battery and a harness, wherein
the current sensor is mounted on the connection member,
the connection member includes a predetermined portion, a current density of which is higher than that of other portions of the connection member,
the detection portion of the current sensor is disposed on the predetermined portion of the connection member when the current sensor is mounted on the connection member,
the current sensor includes a concavity,
the connection member includes a protrusion corresponding to the concavity of the current sensor, and
the protrusion of the connection member is engageable with the concavity of the current sensor.

10. A mounting structure of a current sensor comprising:
the current sensor including a detection portion; and
a connection member for electrically connecting between a battery post of a battery and a harness, wherein
the current sensor is mounted on the connection member,
the connection member includes a predetermined portion, a current density of which is higher than that of other portions of the connection member,
the detection portion of the current sensor is disposed on the predetermined portion of the connection member when the current sensor is mounted on the connection member
the current sensor includes a protrusion,
the connection member includes a concavity corresponding to the protrusion of the current sensor, and
the protrusion of the current sensor is engageable with the concavity of the connection member.

* * * * *